United States Patent
Lee et al.

(10) Patent No.: US 12,381,143 B2
(45) Date of Patent: Aug. 5, 2025

(54) SELF-ALIGN VIA STRUCTURE BY SELECTIVE DEPOSITION

(71) Applicant: Taiwan Semiconductor Manufacturing Company Limited, Hsinchu (TW)

(72) Inventors: Shao-Kuan Lee, Kaohsiung (TW); Hsin-Yen Huang, New Taipei (TW); Cheng-Chin Lee, Taipei (TW); Hai-Ching Chen, Hsinchu (TW); Shau-Lin Shue, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/361,567

(22) Filed: Jul. 28, 2023

(65) Prior Publication Data
US 2024/0021517 A1    Jan. 18, 2024

Related U.S. Application Data

(63) Continuation of application No. 17/193,595, filed on Mar. 5, 2021, now Pat. No. 11,756,878.

(51) Int. Cl.
*H01L 23/522*    (2006.01)
*H01L 21/768*    (2006.01)
*H01L 23/528*    (2006.01)

(52) U.S. Cl.
CPC .... *H01L 23/5226* (2013.01); *H01L 21/76804* (2013.01); *H01L 21/76829* (2013.01); *H01L 21/76877* (2013.01); *H01L 23/5283* (2013.01)

(58) Field of Classification Search
CPC .......... H01L 23/5226; H01L 21/76804; H01L 21/76829; H01L 21/76877; H01L 23/5283
See application file for complete search history.

(56) References Cited

U.S. PATENT DOCUMENTS 10,177,028 B1    1/2019    Licausi et al.
2019/0363008 A1*  11/2019   Gstrein ............ H01L 21/76877
2022/0020638 A1   1/2022    Bhosale et al.

\* cited by examiner

*Primary Examiner* — Karen Kusumakar
(74) *Attorney, Agent, or Firm* — FOLEY & LARDNER LLP

(57) ABSTRACT

In one embodiment, a self-aligned via is presented. In one embodiment, an inhibitor layer is selectively deposited on the lower conductive region. In one embodiment, a dielectric is selectively deposited on the lower conductive region. In one embodiment, the deposited dielectric may be selectively etched. In one embodiment, an inhibitor is selectively deposited on the lower dielectric region. In one embodiment, a dielectric is selectively deposited on the lower dielectric region. In one embodiment, the deposited dielectric over the lower conductive region has a different etch rate than the deposited dielectric over the lower dielectric region which may lead to a via structure that is aligned with the lower conductive region.

20 Claims, 25 Drawing Sheets

SELF-ALIGN VIA STRUCTURE BY SELECTIVE DEPOSITION

CROSS-REFERENCE TO RELATED APPLICATION

This application is a continuation of U.S. patent application Ser. No. 17/193,595, filed Mar. 5, 2021, and titled "NOVEL SELF-ALIGNED VIA STRUCTURE BY SELECTIVE DEPOSITION," the entire contents of which are incorporated herein by reference for all purposes.

BACKGROUND

The present disclosure generally relates to semiconductor devices, and particularly to interconnect structures and methods for their fabrication.

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines and the spacing between the conductive lines of back-end of line (BEOL) multi-layer interconnect structures also need to scale smaller.

Multi-layer metal interconnects are often formed using damascene processes rather than by direct etching. Damascene processes are typically either single or dual damascene, which includes forming openings by patterning and etching inter-metal dielectric (IMD) layers and vias and filling the openings with metal. However, as critical dimension and pitch continue to scale down, there are some challenges in aligning the connecting vias with the metal lines.

To accommodate these smaller scale of the back-end of line, there is a need for an improved metal interconnect, and a method of forming thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
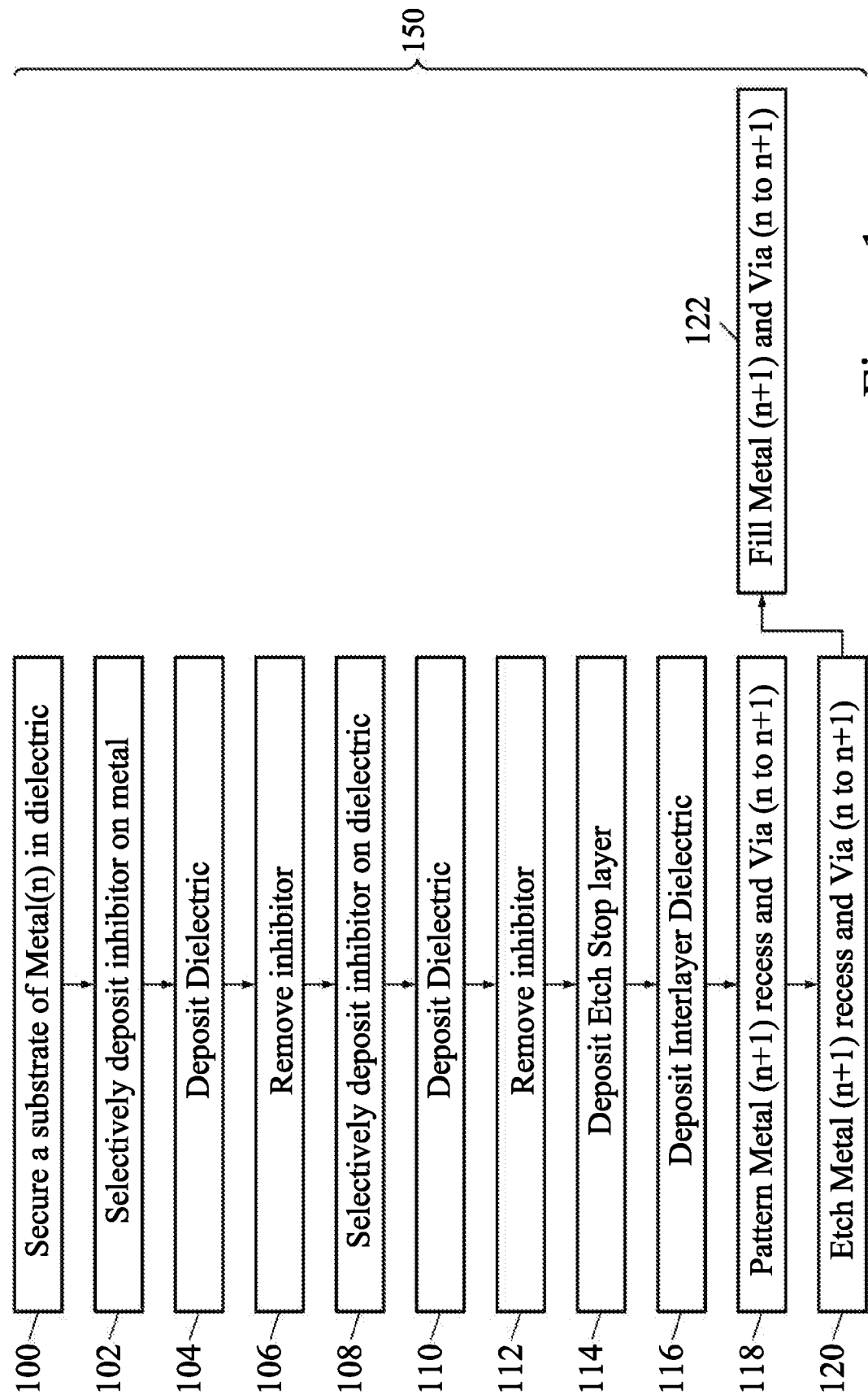
FIG. 1 illustrates a method of generating a self-aligned via structure by selective deposition in accordance with some embodiments.

As critical dimensions (CD) shrink, new methods of forming multi-layer interconnects are needed. For instant, as pitch shrinks and CD dielectric spacing shrinks below 12 nm, optical overlay control within 6 nm ceases to be effective. Lack of control can result in problems such as overlay (OVL) shift and CD enlargement.

In cases where via landing deviates due to problems such as OVL shift and CD enlargement, performance may be negatively affected. Such problems as degradation of via-to-line breakdown, line-to-line breakdown, line-to-line leakage, and time-dependent gate oxide breakdown (TDDB) are likely to occur. In order to mitigate such problems using conventional schemes, more and more complicated etch processes with dry-wet-dry-wet etch are needed. Hence, improved structures and methods of via alignment are necessary for shrinking multilayer interconnects. Disclosed herein are novel structures and methods for forming self-aligned via structures by selective deposition.

The resulting structure may exhibit self-alignment of the via structure to the bottom metal layer. The self-aligned via structure may have the advantages of increased reliability, lower RC performance and lower capacitance. In the case of lithography misalignment, the upper portion of the via may remain self-aligned with the top conductive region while the bottom portion of the via may remain self-aligned with the lower conductive region. As such, the structure may be more tolerant of lithography misalignment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device formed by a multi-level interconnect structure and methods of producing the same. The multi-level interconnect structure, which may include a metal such as copper, may be formed by a damascene process. The semiconductor device may be included in a microprocessor, memory cell, and/or other integrated circuit (IC). It is noted that the method of FIG. 1 does not produce a completed semiconductor device. A completed semiconductor device may be fabricated using complementary metal-oxide-semiconductor (CMOS) technology processing. Accordingly, it is understood that additional processes may be provided before, during, and after the method 150 of FIG. 1, and that some other processes may only be briefly described herein. Also, FIGS. 2 through 12 are simplified for a better understanding of the present disclosure. For example, although the figures illustrate the semiconductor device, it is understood the IC may comprise a number of other devices comprising transistors, resistors, capacitors, inductors, fuses, etc.

FIG. 1 is a flowchart illustrating a method 150 for fabricating a semiconductor device, according to various aspects of the present disclosure. FIGS. 2, 3, 4, 5, 6, 7, 8, 9, 10, 11 and 12 show schematic cross-sectional views of the semiconductor device at various stages of fabrication according to an embodiment of the method 150 of FIG. 1.

Figure 2:
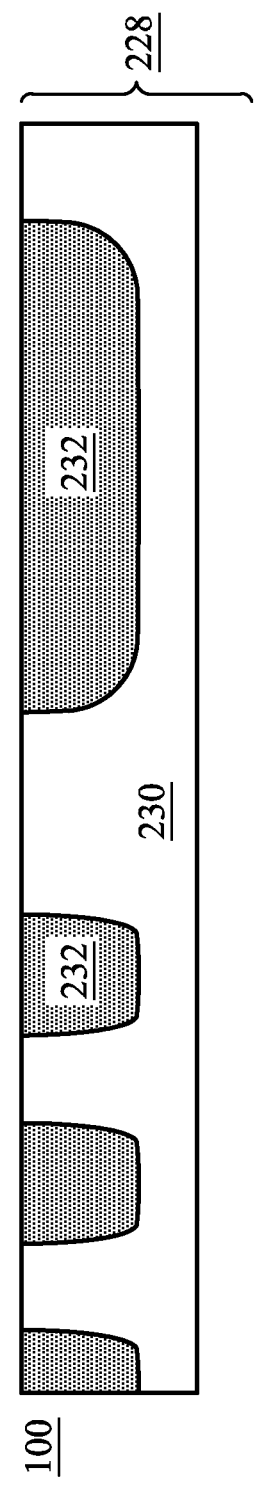
FIGS. 2, 3, 4, 5, 6, 7, 8, 9, 10, 11, 12, 13 and 14 illustrate cross-sectional views of an example semiconductor device during various fabrication stages, made by the method of FIG. 1, in accordance with some embodiments.

Referring to FIGS. 1 and 2, the method 150 proceeds to step 100 in which a semiconductor substrate 228 including a metal (n) 232 conductive region formed in a dielectric 230 material is secured. The semiconductor substrate 228 is a substrate as employed in a semiconductor integrated circuit fabrication, and integrated circuits may be formed therein and/or thereupon. The term "semiconductor substrate" as used herein refers to as any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices.

As shown, a conductive region 232 may be part of the semiconductor substrate 228 (e.g., in the semiconductor substrate 228 exposed by recessing to form the conductive region 232). The conductive region 232 may be formed in and/or on the dielectric layer 230. The dielectric layer 230 may be formed on substrate 228 in some embodiments. The conductive region 232 may be a portion of conductive routes and have exposed surfaces that may be treated by a planarization process, such as chemical mechanical polishing (CMP). Suitable materials for the conductive region 232 may include, but are not limited to, for example copper, aluminum, copper alloy, or other mobile conductive materials. The semiconductor substrate 228 containing such a metal conductive region 232 may be the first or any subsequent metal interconnect level of the semiconductor device. The conductive region may be capped. The cap may enhance reliability.

The dielectric layer 230 may be a single layer or a multi-layered structure. In some embodiments, the dielectric layer 230 thickness varies with the applied technology, for example a thickness of about 1000 angstroms to about 30000 angstroms. In some embodiments, the dielectric layer 230 is silicon oxide, carbon-doped silicon oxide, a comparatively low dielectric constant (k value) dielectric material with a k value less than about 4.0, or combinations thereof. In some embodiments, the dielectric layer 230 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 230 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 230 is a nitrogen-containing layer, a carbon-containing layer, or a carbon-containing and nitrogen-containing layer. In one embodiment, the dielectric layer 230 is a silicon-containing and nitrogen-containing dielectric layer. In another embodiment, the dielectric layer 230 is a silicon-containing and carbon-containing dielectric layer. In yet another embodiment, the dielectric layer 230 is a silicon-containing, nitrogen-containing, and carbon-containing dielectric layer. In one embodiment, the dielectric layer 230 has a ratio by weight of carbon to silicon about equal or greater than 0.5. In another embodiment, the dielectric layer 230 has a ratio by weight of nitrogen to silicon about equal or greater than 0.3. In yet another embodiment, the dielectric layer 230 has a ratio by weight of carbon to silicon about equal or greater than 0.5 and a ratio by weight of nitrogen to silicon about equal or greater than 0.3.

Figure 3:
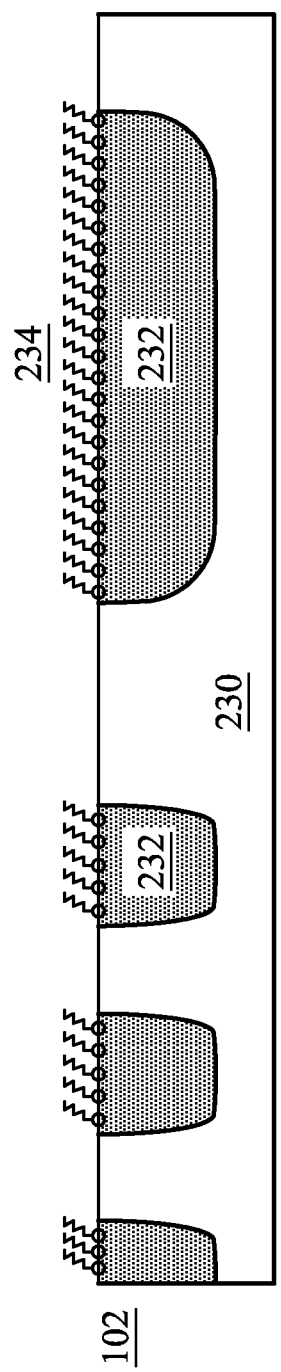

Referring to FIGS. 1 and 3, the method 150 proceeds to step 102 in which an inhibitor 234 may be selectively deposited on conductive region 232. The conductive region 232 may be metal and the inhibitor may be deposited on the metal. The metal may be capped with a metal capping layer. The capping layer may be formed by ion implantation, plasma treatment, gas soak, or many others. The capping layer may be an alloy of the conductive region or consist of molecules made of elements such as Cu, Si, N, C, 0, or many other commonly used capping layers. The inhibitor may be deposited on the metal capping layer. The inhibitor 234 may form an inhibitor blocking layer 234.

The inhibitor blocking layer 234 may be a self-assembled monolayer (SAM). The self-assembled monolayer may have one or more of an anchor group, a tail, and a functional end group. The anchor group may include phosphorous, sulfur, silicon, carbon, or nitrogen. The anchor group may include thiols, silanes, or phosphonates. The inhibitor blocking layer 234 may be made up of molecules such as benxotriazole (BTA).

The inhibitor blocking layer 234 may be deposited using a dry technique such as atomic layer deposition (ALD), chemical vapor deposition (CVD), or vapor ALD. The inhibitor blocking layer 234 may be deposited using a catalyzed growth technique. The inhibitor blocking layer 234 may be deposited using any of LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The inhibitor blocking layer 234 may be deposited using wet techniques such as spin-on, dipping, or spraying approaches. For instance, the inhibitor blocking layer 234 may be a composition that will bind to exposed groups on the conductive region 232. For instance, the inhibitor blocking layer 234 may include a thiol functional group that may bind selectively to the conductive region 232. In some cases the surface of the conductive region 232 may be pretreated to form groups to selectively bind to groups on the inhibitor blocking layer 234. In some cases, the wafer may be washed after deposition on the inhibitor blocking layer 234 such that the inhibitor blocking layer 234 only remains in the regions over the conductive region 232

In some embodiments the surface of the conductive region 232 may be treated to allow for deposition of the inhibitor blocking layer 234. In some embodiments, the treatment process can be configured to treat or otherwise modify a top boundary of the conductive region 232. The treatment gas may react with atoms of the conductive region 232. For example, the treatment process can include a hydrogen ($H_2$) plasma process, used to supply hydrogen for the bonds between the conductive region 232 and hydrogen, by flowing hydrogen gas or precursor into a vacuum (airtight) chamber. In another example, the treatment process can include a nitrogen ($N_2$) plasma process, used to supply nitrogen for the bonds between the conductive region 232 and nitrogen, by flowing nitrogen gas or precursor into a vacuum (airtight) chamber. In yet another example, the treatment process can include an ammonia ($NH_3$) plasma process, used to supply nitrogen and/or hydrogen for the bonds between conductive region 232 and nitrogen and/or hydrogen, by flowing nitrogen gas or precursor into a vacuum (airtight) chamber. In yet another example, the treatment process can include an oxygen ($O_2$) plasma treatment, used to supply oxide bonds. In yet another example, the treatment process may include a soaking process, used to soak the conductive region 232, by flowing corresponding gas or precursor into a vacuum (airtight) chamber, without forming plasma. In some embodiments, the gas soak may be a gas such as $H_2$, $N_2$, $NH_3$, $CO_2$, $O_2$, air, or mixtures of these. In some embodiments the deposition or treatment may be at room temperature. In some embodiments the deposition or treatment may be at a temperature above room temperature.

Treatments for the inhibitor blocking layer 234 may include dry approaches such gas soak or plasma treatment. In some embodiments treatment may include wet approaches such as an acid clean, solution clean, or wet etch.

Figure 4:
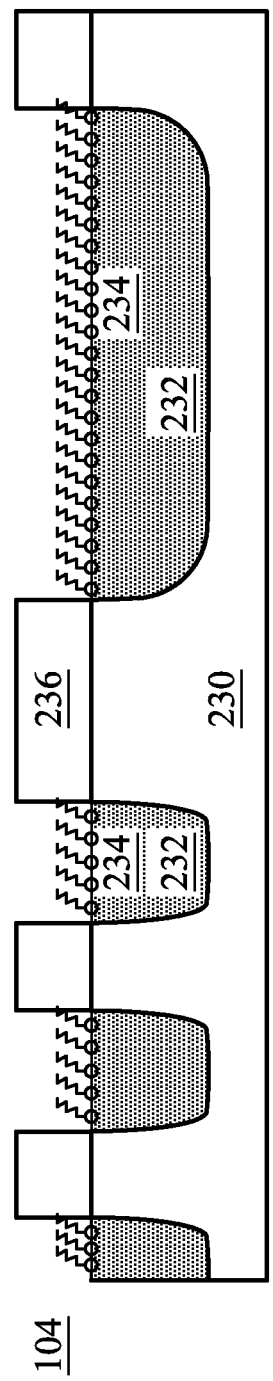

Referring to FIGS. 1 and 4, the method 150 proceeds to step 104 in which a dielectric 236 may be selectively deposited in the region where the inhibitor 234 is not deposited. The dielectric 236 may be deposited over the dielectric 230 and not deposited over the conductive region 232 over which has been deposited the inhibitor 234. The dielectric 236 may be a single layer or a multi-layered structure. In some embodiments, the dielectric 236 thickness may be about 5 angstroms. In some embodiments, the dielectric 236 thickness may between about 5 angstroms to about 70 nanometers. In some embodiments, the dielectric 236 is silicon oxide, carbon-doped silicon oxide, a comparatively low dielectric constant (k value) dielectric material with a k value less than about 4.0, or combinations thereof. In some embodiments, the dielectric layer 236 is formed of a material, including low-k dielectric material, extreme low-k dielectric material, porous low-k dielectric material, and combinations thereof. A wide variety of materials may be employed in accordance with embodiments, for example, lower dielectric constant materials composed of Si, O, oxide, nitride, or carbide composite films. Examples of possible embodiments may include spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric 236 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer.

Figure 5:
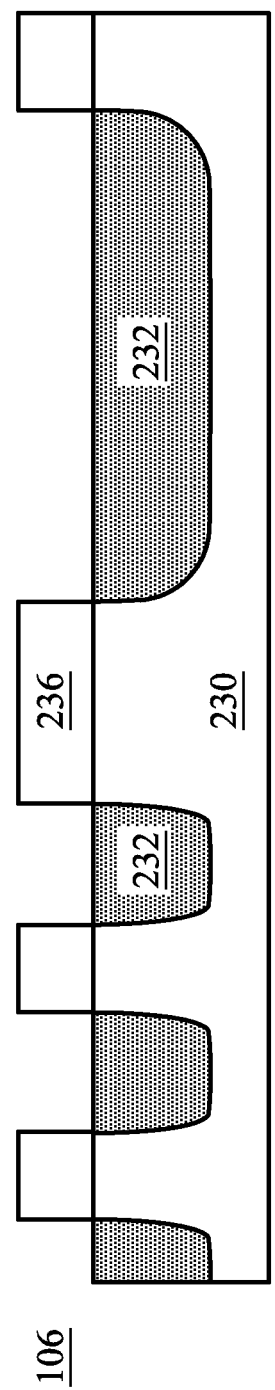

Referring to FIGS. 1 and 5, the method 150 proceeds to step 106 in which the inhibitor may be removed. The inhibitor may be removed by a dry processing approach. Examples of dry processing approaches include a gas soak. Gases such as $H_2$, $N_2$, $NH_3$, $CO_2$, $O_2$, air, or mixtures thereof may be used for the gas soak. The gas soak may occur at ambient or elevated temperatures. Other examples of a dry processing approach is plasma treatment in a vacuum environment or in the presence of any of $H_2$, $N_2$, $NH_3$, $CO_2$, $O_2$, air, or mixtures thereof at ambient or elevated temperatures. Examples of wet processing approach include an acid clean, acid etch, solution clean, or solution etch at ambient or elevated temperatures.

Figure 6:
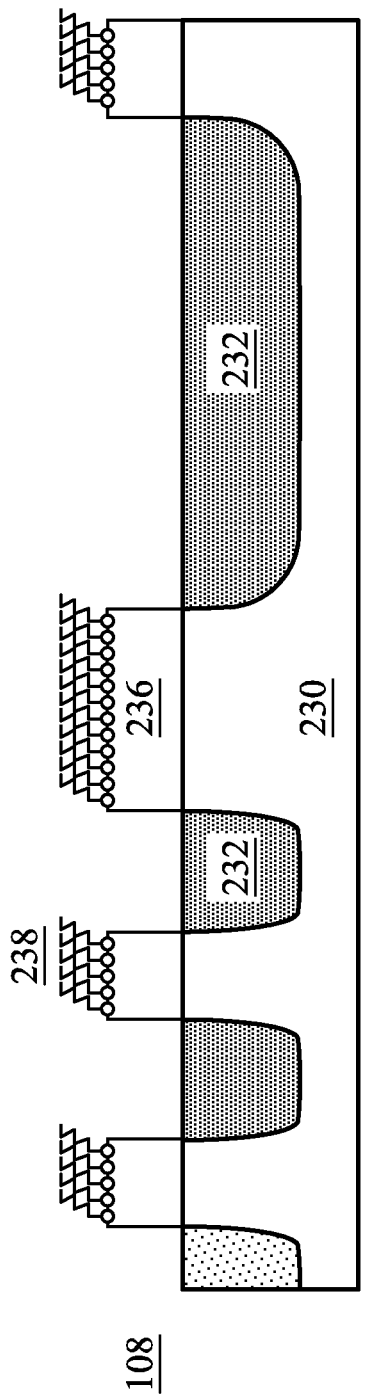

Referring to FIGS. 1 and 6, the method 150 proceeds to step 108 in which an inhibitor may be selectively deposited on the dielectric 236. The inhibitor may be a self-assembled monolayer or other molecules. The self-assembled monolayer may have one or more of an anchor group, a tail, and a functional end group. The anchor group may include one of silicon, carbon, and nitrogen.

The inhibitor blocking layer 238 may be deposited using a dry techniques such as atomic layer deposition (ALD), chemical vapor deposition (CVD), or vapor ALD. The inhibitor blocking layer 238 may be deposited using a catalyzed growth technique. The inhibitor blocking layer 238 may be deposited using any of LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures. The inhibitor blocking layer 238 may be deposited using wet techniques such as spin-on, dipping, or spraying approaches.

In some embodiments the surface of the dielectric region 236 may be treated to allow for deposition of the inhibitor blocking layer 238. In some embodiments, the treatment process can be configured to treat or otherwise modify a top boundary of the dielectric region 236. The treatment gas may react with atoms of the dielectric region 236. For example, the treatment process can include a hydrogen $H_2$ plasma process, used to supply hydrogen for the bonds between the dielectric region 236 and hydrogen, by flowing hydrogen gas or precursor into a vacuum (airtight) chamber. In another example, the treatment process can include a nitrogen ($N_2$) plasma process, used to supply nitrogen for the bonds between the dielectric region 236 and nitrogen, by flowing nitrogen gas or precursor into a vacuum (airtight) chamber. In yet another example, the treatment process can include an ammonia ($NH_3$) plasma process, used to supply nitrogen and/or hydrogen for the bonds between dielectric region 236 and nitrogen and/or hydrogen, by flowing nitrogen gas or precursor into a vacuum (airtight) chamber. In yet another example, the treatment process can include an oxygen ($O_2$) plasma treatment, used to supply oxide bonds. In yet another example, the treatment process may include a soaking process, used to soak the dielectric region 236, by flowing corresponding gas or precursor into a vacuum (airtight) chamber, without forming plasma. In some embodiments, the gas soak may be a gas such as $H_2$, $N_2$, $NH_3$, $CO_2$, $O_2$, air, or mixtures of these. In some embodiments the deposition or treatment may be at room temperature. In some embodiments the deposition or treatment may be a temperature above room temperature.

Treatments for the inhibitor blocking layer 238 may include dry approaches such gas soak of gasses such as $H_2$, $N_2$, $NH_3$, $CO_2$, $O_2$, air or mixtures. Another example of a dry approach is plasma treatment in environments such as $H_2$, $N_2$, $NH_3$, $CO_2$, $O_2$, air or mixtures. In some embodiments treatment may include wet approaches such as an acid clean, solution clean, or wet etch. The foregoing dry and wet approaches may be carried out at room temperature. The foregoing dry and wet approaches may be carried out at elevated temperatures.

Figure 7:
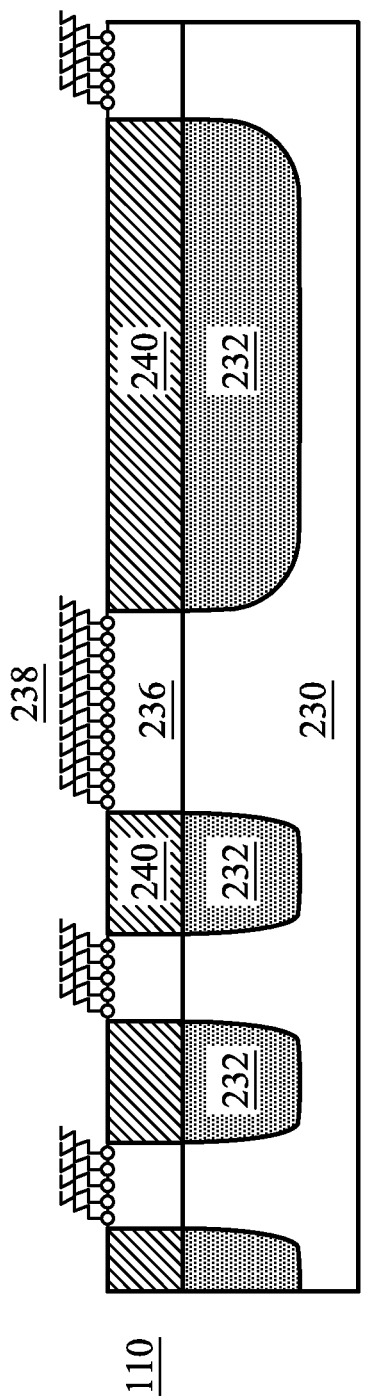

Referring to FIGS. 1 and 7, the method 150 proceeds to step 110 in which a dielectric 240 may be deposited on the region where the inhibitor is not present. The dielectric 240 may be deposited over the conductive region 232. The dielectric 240 may be deposited by chemical vapor deposition (CVD), atomic layer deposition (ALD), molecular layer deposition (MLD), spin-on deposition or other processes. The dielectric 240 may have a higher etching selectivity allowing for a faster etch rate when compared with dielectric 236. The dielectric 240 material may be Al, Zr, Y, Hf or Ti in oxide, nitride, or carbide composite films. The thickness of the dielectric 240 may range from less than 5 angstroms to about 70 nm.

Figure 8:
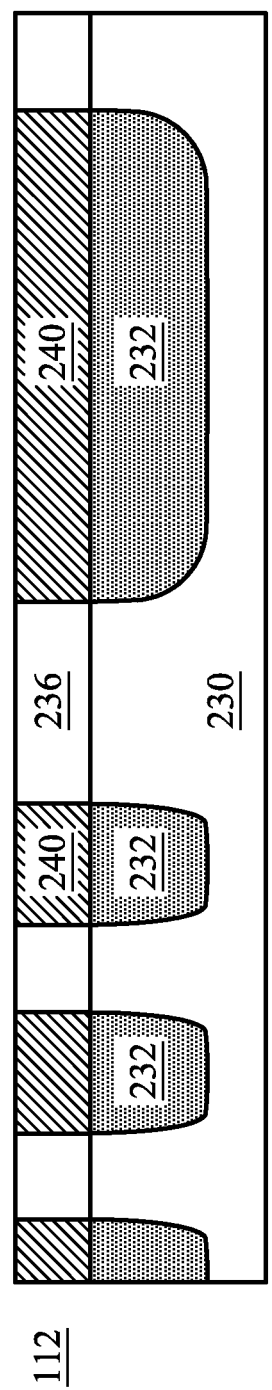

Referring to FIGS. 1 and 8, the method 150 proceeds to step 112 in which the inhibitor may be removed. The inhibitor may be removed by a dry processing approach. Examples of dry processing approaches include a gas soak in a gas such as $H_2$, $N_2$, $NH_3$, $CO_2$, $O_2$, air, or mixtures thereof at ambient or elevated temperatures. Other examples of a dry processing approach include plasma treatment in a vacuum environment or in the presence of any of $H_2$, $N_2$, $NH_3$, $CO_2$, $O_2$, air, or mixtures thereof at room or elevated temperatures. Examples of wet processing approaches include an acid clean, acid etch, solution clean, or solution etch at ambient or elevated temperatures.

Figure 9:
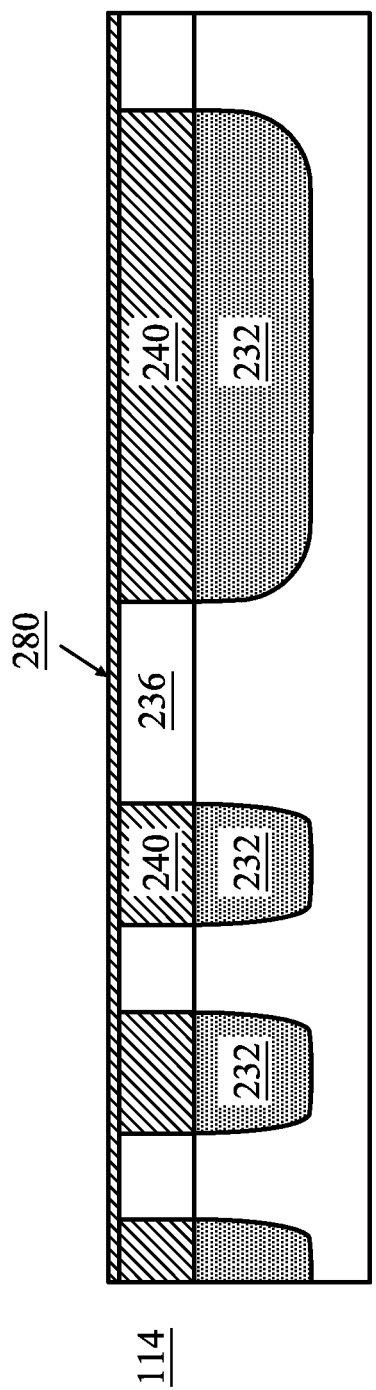

Referring to FIGS. 1 and 9, the method 150 proceeds to step 114 where an etch stop layer 280 may be deposited. The etch stop layer 280 may be deposited over the top of the surface. The etch stop layer 289 may cover the dielectric 240 and dielectric 236. The etch stop layer 280 functions for controlling the end point during subsequent etching processes. In some embodiments, the etch stop layer 280 is formed of silicon oxide, silicon nitride, silicon carbide, silicon oxynitride or combinations thereof. In some embodiments, the etch stop layer 280 has a thickness of about 10 angstroms to about 1000 angstroms. The etch stop layer 280 is formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

Figure 10:
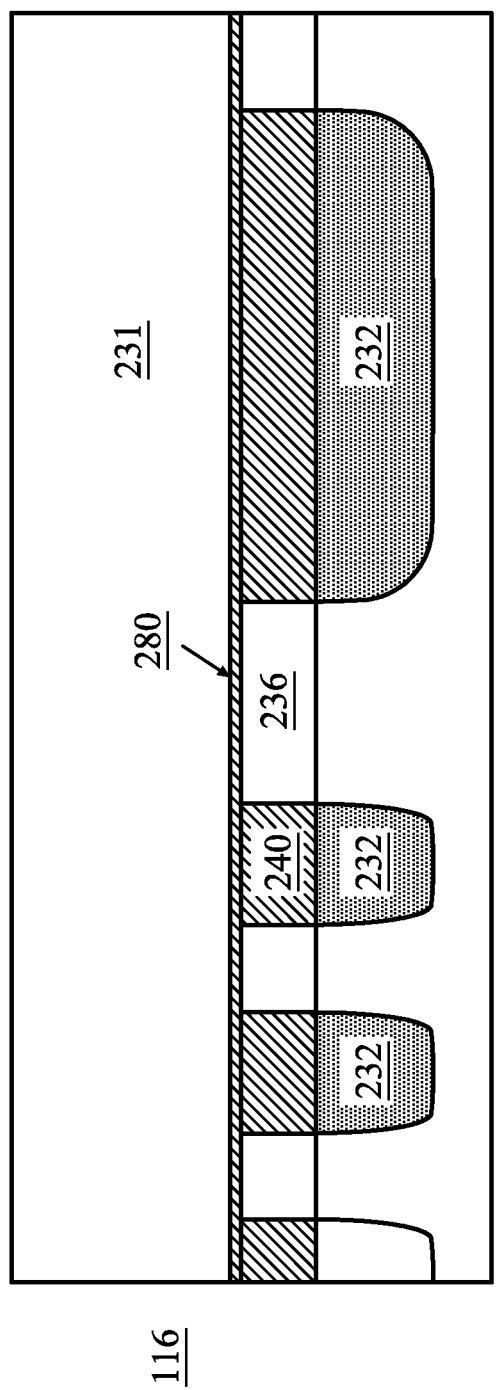

Referring to FIGS. 1 and 10, the method 150 proceeds to step 116 where a dielectric layer 231 may be deposited. The dielectric layer 231 may be deposited over the etch stop layer 280. The dielectric layer 231 may be a single layer or a multi-layered structure. In some embodiments, the dielectric layer 231 thickness varies with the applied technology, for example a thickness of about 1000 angstroms to about 30000 angstroms. In some embodiments, the dielectric layer 231 is silicon oxide, carbon-doped silicon oxide, a comparatively low dielectric constant (k value) dielectric material with a k value less than about 4.0, or combinations thereof. In some embodiments, the dielectric layer 231 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less.

A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 231 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 231 is a nitrogen-containing layer, a carbon-containing layer, or a carbon-containing and nitrogen-containing layer. In some embodiments, the dielectric layer 231 is a silicon-containing and nitrogen-containing dielectric layer. In some embodiments, the dielectric layer 231 is a silicon-containing and carbon-containing dielectric layer. In yet another embodiment, the dielectric layer 231 is a silicon-containing, nitrogen-containing, and carbon-containing dielectric layer. In one embodiment, the dielectric layer 231 has a ratio by weight of carbon to silicon about equal or greater than 0.5. In another embodiment, the dielectric layer 231 has a ratio by weight of nitrogen to silicon about equal or greater than 0.3. In yet another embodiment, the dielectric layer 231 has a ratio by weight of carbon to silicon about equal or greater than 0.5 and a ratio by weight of nitrogen to silicon about equal or greater than 0.3.

Figure 11:
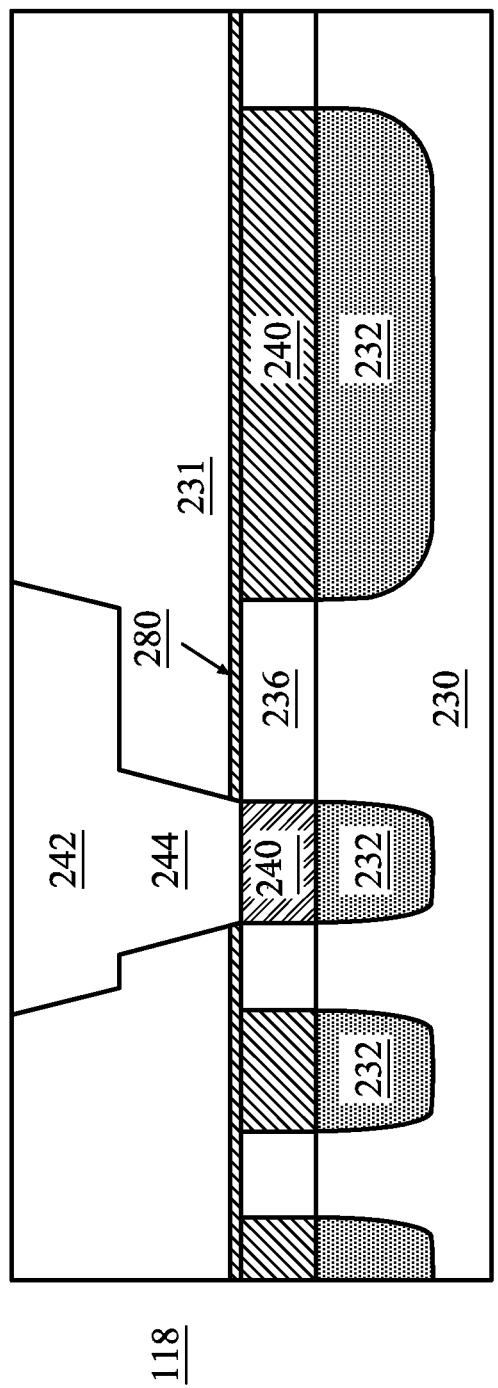

Referring to FIGS. 1 and 11, the method 150 proceeds to step 118 where the trench for conductive region (n+1) and via (n to n+1) may be patterned. The trench and via may be etched for via landing. The trench and via may be etched using a dual damascene process. The trench is patterned in the dielectric layer 231 and the etch stop layer 281 to define a contact region on the semiconductor substrate. Although the embodiments illustrate dual damascene openings, a single damascene process may also be used. In dual damascene techniques including a "via-first" patterning method or a "trench-first" patterning method, the trench 242 and the via 244 may be formed using a typical lithographic with masking technologies and anisotropic etch operation (e.g. plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the dielectric layer 231, providing a clear indicator of when to end a particular etching process. Those skilled in the art will recognize that in some embodiments additional layers may also be present as detailed in the art.

Figure 12:
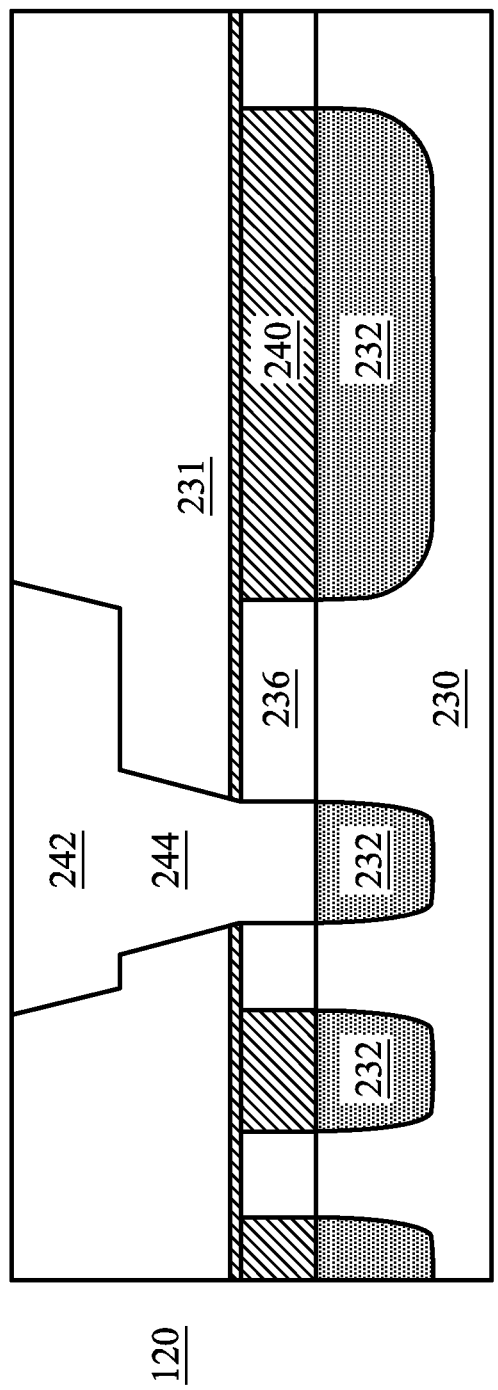

Referring to FIGS. 1 and 12, the method 150 proceeds to step 120 which may include a wet clean process for post etch. The wet clean process may also remove the dielectric 240. The via may self-align due to the etching selectivity of dielectric 240. Dielectric 240 may have a superior etching selectivity to the etching selectivity of dielectric 236 and dielectric 231. The etching selectivity may prevent etch punch into dielectric 236. The selective dielectric 240 may be converted to be removed by the wet cleaning using a selective etching process. The wet clean may be an acid clean, acid etch, solution clean, or solution etch. The wet clean may use an RCA process. The wet clean may occur at room, low, or elevated temperatures. The wet clean may be isotropic or anisotropic. Example of wet clean chemicals include hydrochloric acid, hydrogen peroxide, hydrofluoric acid, sulfuric acid, standard clean-1 (SC-1), ammonia hydrogen peroxide mixture (APM), hydrochloric acid hydrogen peroxide mixture (HPM), sulfuric acid hydrogen peroxide mixture (SPM) and many others commonly known in the industry. This list is representative and those skilled in the art are aware of the many chemicals currently used and which may in the future be used in the wet etch process.

Figure 13:
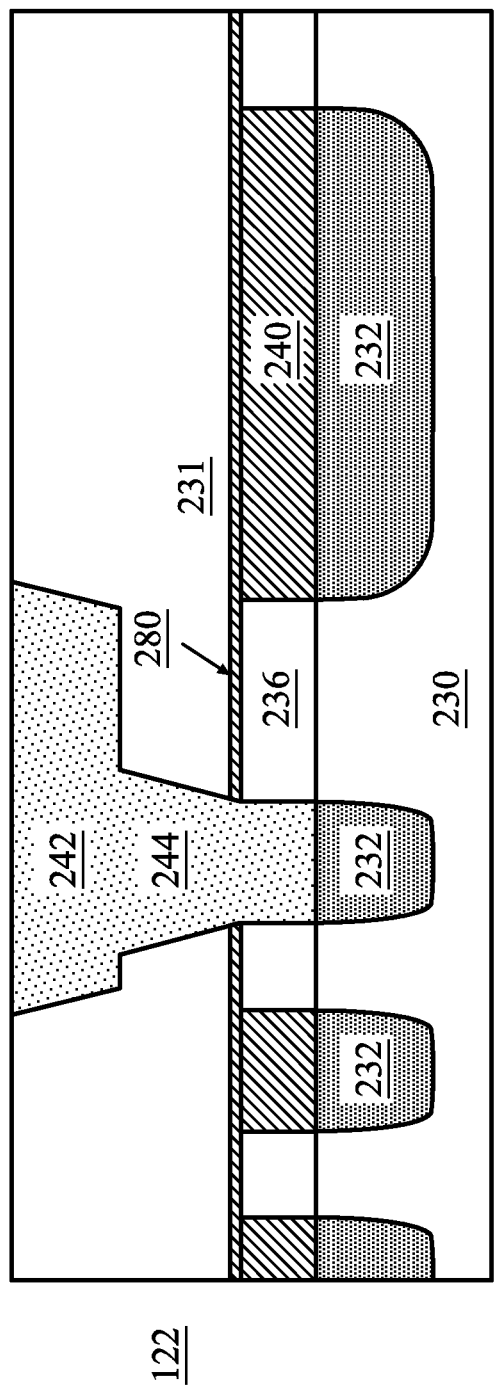

Referring to FIGS. 1 and 13, the method 150 proceeds to step 122 where the trench 242 and via 244 may be filled. The trench 242 and via 244 may be filled with a conductive material. The trench 242 and via 244 may be filled using a metallization for metal gap-filling. In some embodiments, the trench 242 and via 244 conductive material may also include a selective barrier. In some embodiments, the conductive material is formed as an interconnect structure in the dielectric layer 231. In some embodiments, the conductive material is deposited by an electro-chemical plating (ECP) process, physical vapor deposition (PVD), chemical vapor deposition (CVD), plasma enhanced CVD (PECVD), low pressure CVD (LPCVD), atomic layer deposition (ALD), or other well-known deposition techniques. In some embodiments, the conductive material at least contains a main metal element, e.g., copper (Cu). In some embodiments, the conductive material further contains an additive metal element. In some embodiments, the additive metal element in the conductive material is tantalum (Ta), indium (In), tin (Sn), zinc (Zn), manganese (Mn), chromium (Cr), titanium (Ti), germanium (Ge), strontium (Sr), platinum (Pt), magnesium (Mg), aluminum (Al), or zirconium (Zr). In some embodiments a portion of the conductive material in the conductive region 242 over the dielectric layer 231 is removed. In some embodiments, the removing process is chemical mechanical polishing (CMP) process performed to remove the excess portions of the conductive material outside the conductive region 242, thus exposing the dielectric layer 231 and achieving a planarized surface.

In some embodiments, the conductive material may include a first conductive layer formed to line the sidewalls and bottoms of the trench 242 and via 244. The first conductive layer may include a metal material such as, for example, tantalum (Ta), titanium (Ti), and tungsten (W). In some embodiments, the first conductive layer includes a compound or an alloy of the above-identified metal materials such as, for example, tantalum nitride (TaN), tantalum nitride silicon (TaNSi), titanium tungsten (TiW), and titanium nitride silicon (TiNSi). In some embodiments, the first conductive layer has a thickness of about 10 angstroms to about 250 angstroms. In some embodiments, the first conductive layer may be deposited by using physical vapor deposition (PVD), chemical vapor deposition (CVD), plasma enhanced CVD (PECVD), low pressure CVD (LPCVD), atomic layer deposition (ALD), or other well-known deposition techniques.

Figure 14:
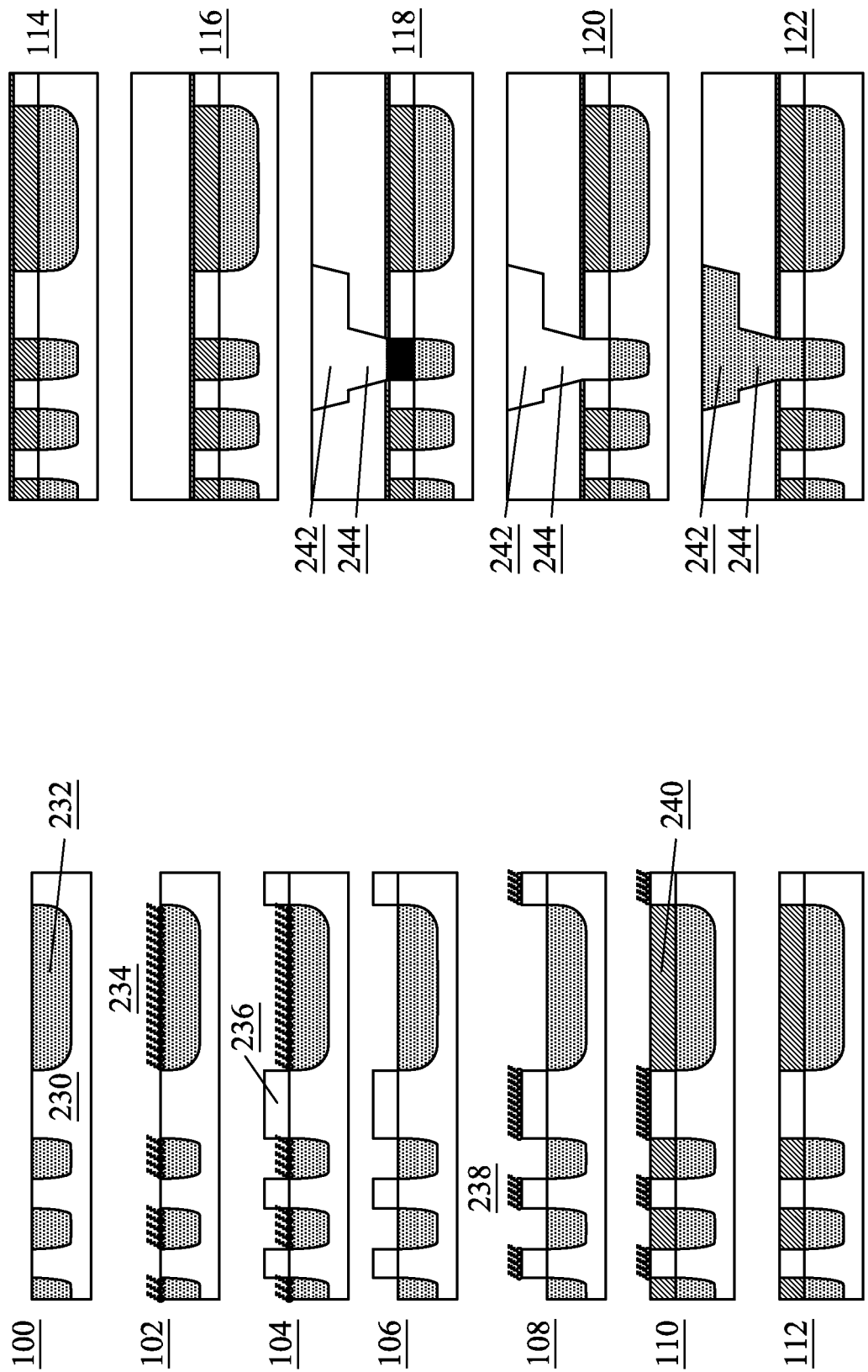

FIG. 14 illustrates exemplary cross-sectional representations of all method steps in method 150. In step 100 a semiconductor substrate 228 including a metal (n) 232 conductive region formed in a dielectric 230 material may be secured. In step 102 an inhibitor 234 may be selectively deposited on conductive region 232. In step 104, a dielectric 236 may be selectively deposited in the region where the inhibitor 234 is not deposited. In step 108, an inhibitor may be selectively deposited on the dielectric 230. In step 110, a dielectric 240 may be deposited on the region where the inhibitor is not present. In 112, the inhibitor may be removed. In step 114, an etch stop layer 280 may be deposited. In step 116, a dielectric layer 231 may be deposited. In step 118 a trench for conductive region (n+1) and via (n to n+1) may be patterned. In step 120, a wet clean process may occur post etch which may also remove the converted dielectric 240. Finally, in step 122 the trench 242 and via 244 may be filled.

Figure 15:
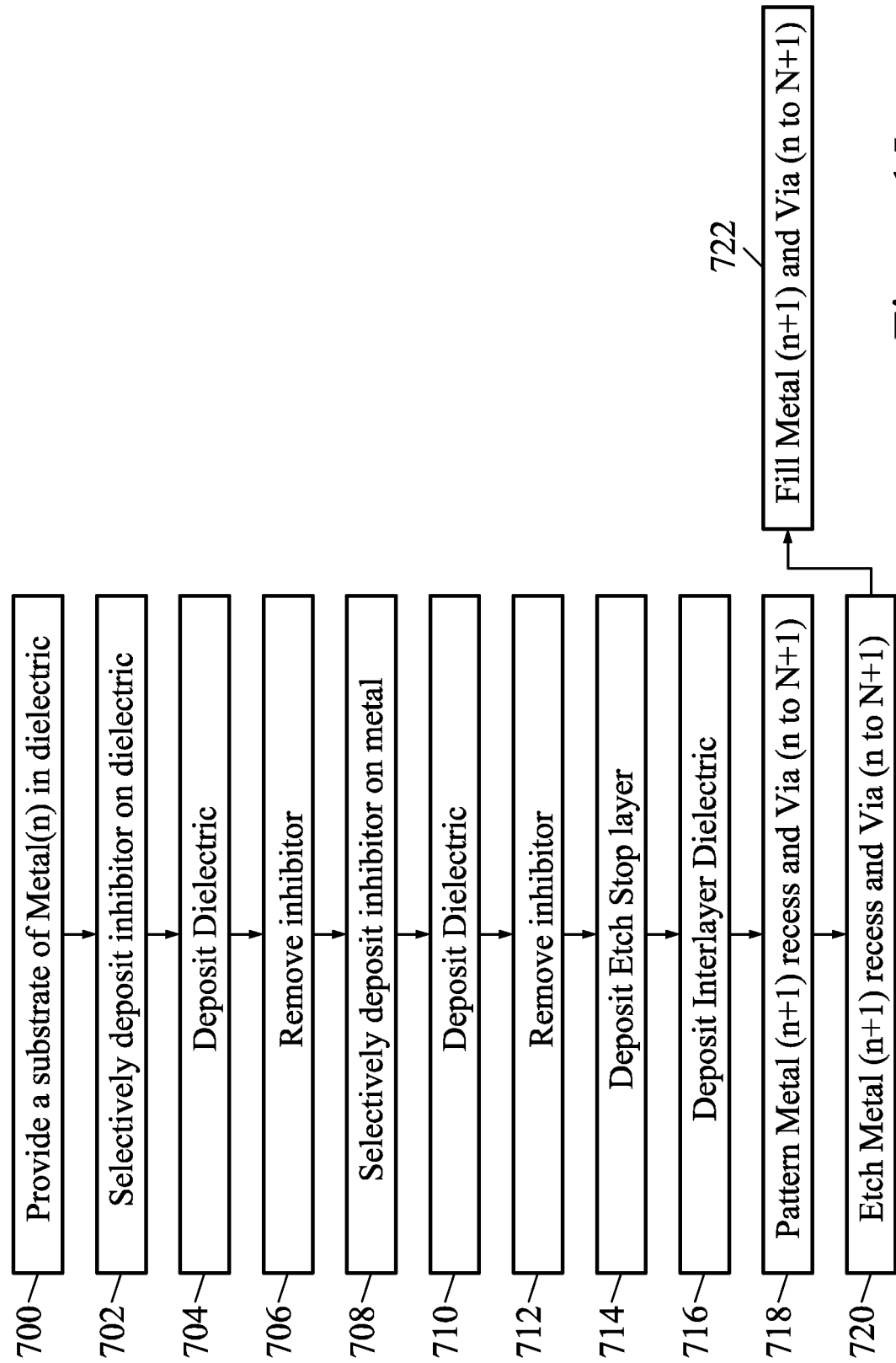
FIG. 15 depicts a method of generating a self-aligned via structure by selective deposition in accordance with some embodiments.

FIG. 15 illustrates an alternate embodiment of the present invention and presents a second embodiment for the method leading to the production of a self-aligned via. In contrast with the previously presented method, in the alternate embodiment the inhibitor is first deposited on the dielectric region 230 rather than on the conductive region 232. The details of the steps correspond to those outlined for the method in FIG. 1 and are omitted here except where it deviates from the details outline in FIG. 1.

At step 700 (corresponding to FIG. 1 step 100), a substrate is provided where the upper surface contains conductive metal separated by a dielectric. At step 702 (corresponding to FIG. 1 step 102), an inhibitor may be selectively deposited on the dielectric surface. At step 704 (corresponding to FIG. 1 step 104), a dielectric may be deposited on the surface of the wafer in the regions where the inhibitor is not deposited. Step 704 may result in the dielectric deposited on the conductive regions of the surface. At step 706 (corresponding to FIG. 1 step 106), the inhibitor is removed. At step 708 (corresponding to FIG. 1 step 108), the inhibitor may be selectively deposited over the conductive region. At step 710 (corresponding to FIG. 1 step 110), dielectric may be deposited in the region where the inhibitor is not present. At step 712 (corresponding to FIG. 1 step 112), the inhibitor is removed. At step 714 (corresponding to FIG. 1 step 114), an etch stop layer may be deposited over the surface of the wafer. At step 716 ((corresponding to FIG. 1 step 116), an interlayer dielectric may be deposited over the etch stop layer. At step 718 (corresponding to FIG. 1 step 118), upper conductive trenches and connecting vias may be patterned. At step 720, (corresponding to FIG. 1 step 120), upper conductive trenches and connecting vias may be etched. At step 722 (corresponding to FIG. 1 step 122), the trench and vias may be filled with conductive material such as metal.

Figure 16:
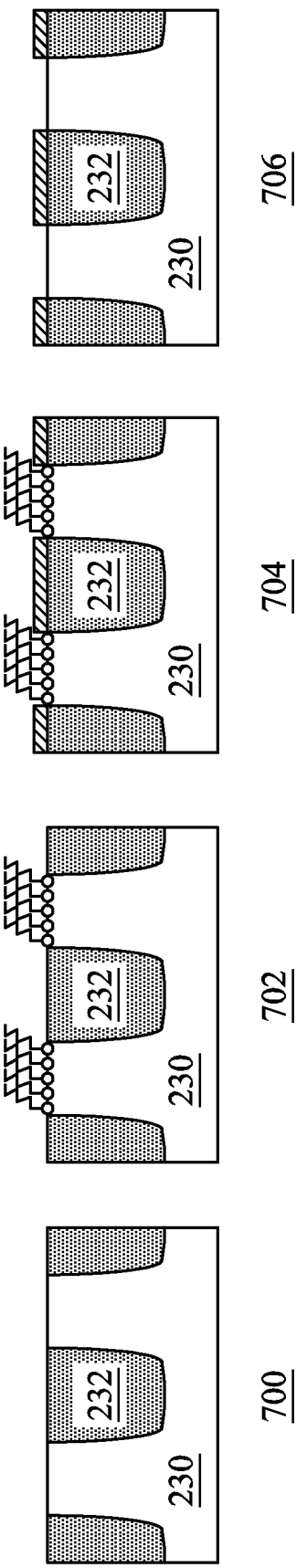
FIG. 16 illustrates cross-sectional views of an example semiconductor device during various fabrication stages, made by the method of FIG. 15, in accordance with some embodiments.

FIG. 16 illustrates cross-sectional representations of the structures formed during steps 700-706 of the second embodiment method. At step 700, a substrate is provided where the upper surface contains conductive metal separated by a dielectric. At step 702, an inhibitor may be selectively deposited on the dielectric surface. At step 704, a dielectric may be deposited on the surface of the wafer in the regions where the inhibitor is not deposited. Step 704 may result in the dielectric deposited on the conductive regions of the surface. At step 706, the inhibitor is removed.

Figure 17:
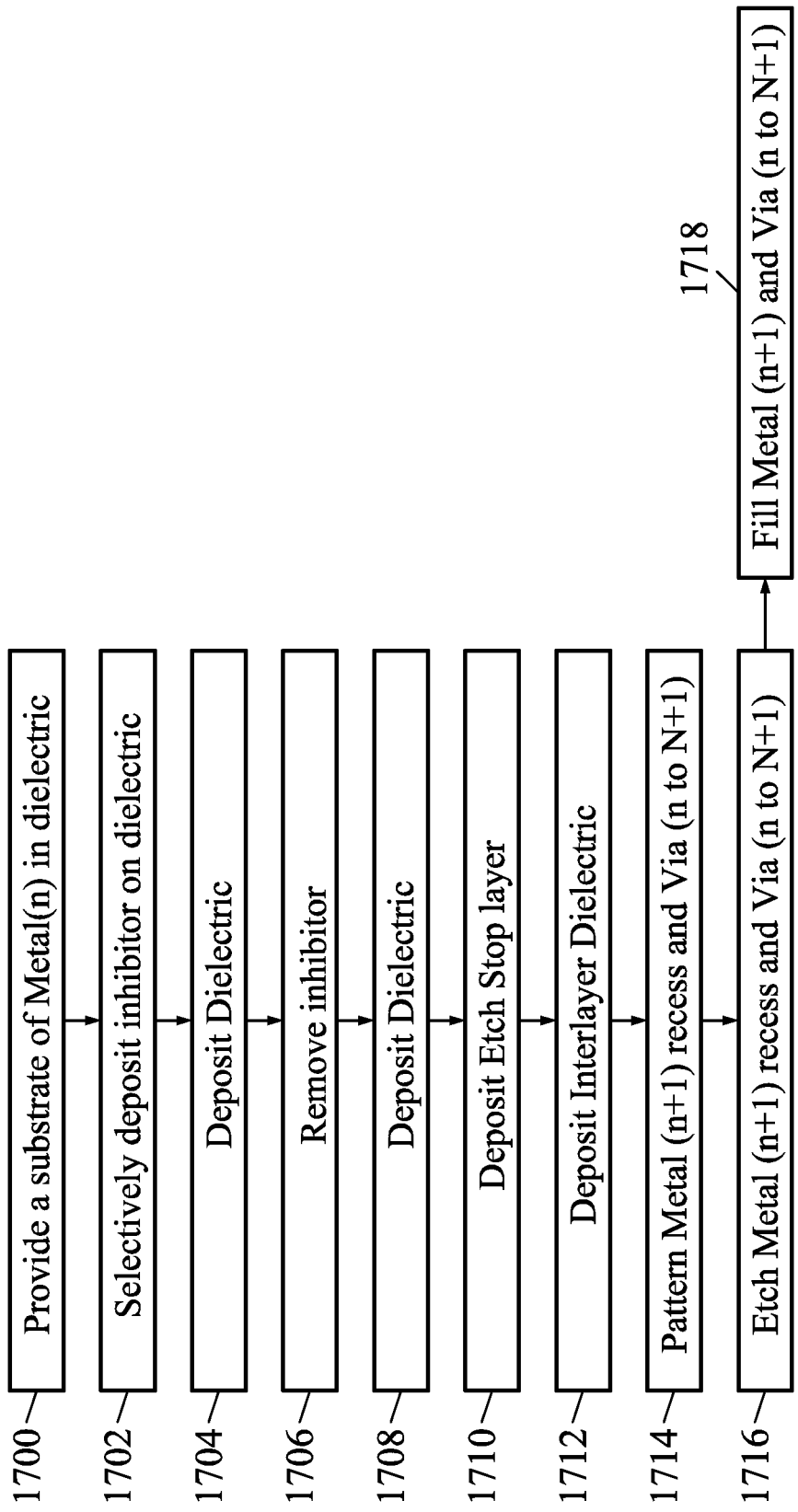
FIG. 17 depicts a method of generating a self-aligned via structure by selective deposition in accordance with some embodiments.

FIG. 17 illustrates an alternate embodiment of the present invention and presents a third embodiment for the method leading to the production of a self-aligned via. In contrast with the first embodiment method, steps 108 and 112 are omitted. Unlike the first embodiment, in the third embodiment the inhibitor is only deposited on the conductive region 232. No inhibitor is deposited on the dielectric region 236.

The details of the steps which correspond to embodiment 1 and correspond to those outlined for the method in FIG. 1 are omitted here except where they deviate from the details outlined in FIG. 1.

At step 1700 (corresponding to FIG. 1 step 100), a substrate is provided where the upper surface contains conductive metal separated by a dielectric. At step 1702 (corresponding to FIG. 1 step 102), an inhibitor may be selectively deposited on the conductive regions of the surface. At step 1704 (corresponding to FIG. 1 step 104), a dielectric may be deposited on the surface of the wafer in the regions where the inhibitor is not deposited. Step 1704 may result in the dielectric deposited on the dielectric regions of the surface. At step 1706 (corresponding to FIG. 1 step 106), the inhibitor is removed.

At step 1708, a dielectric 1802 may be deposited on the surface of the wafer. The dielectric 1802 may coat the entire surface of the wafer. At step 1710 (corresponding to FIG. 1 step 114), an etch stop layer may be deposited over the surface of the wafer. At step 1712 ((corresponding to FIG. 1 step 116), an interlayer dielectric may be deposited over the etch stop layer. At step 1714 (corresponding to FIG. 1 step 118), upper conductive trenches and connecting vias may be patterned. At step 1716, (corresponding to FIG. 1 step 120), upper conductive trenches and connecting vias may be etched. At step 1718 (corresponding to FIG. 1 step 122), the trench and vias may be filled with conductive material such as metal.

Figure 18:
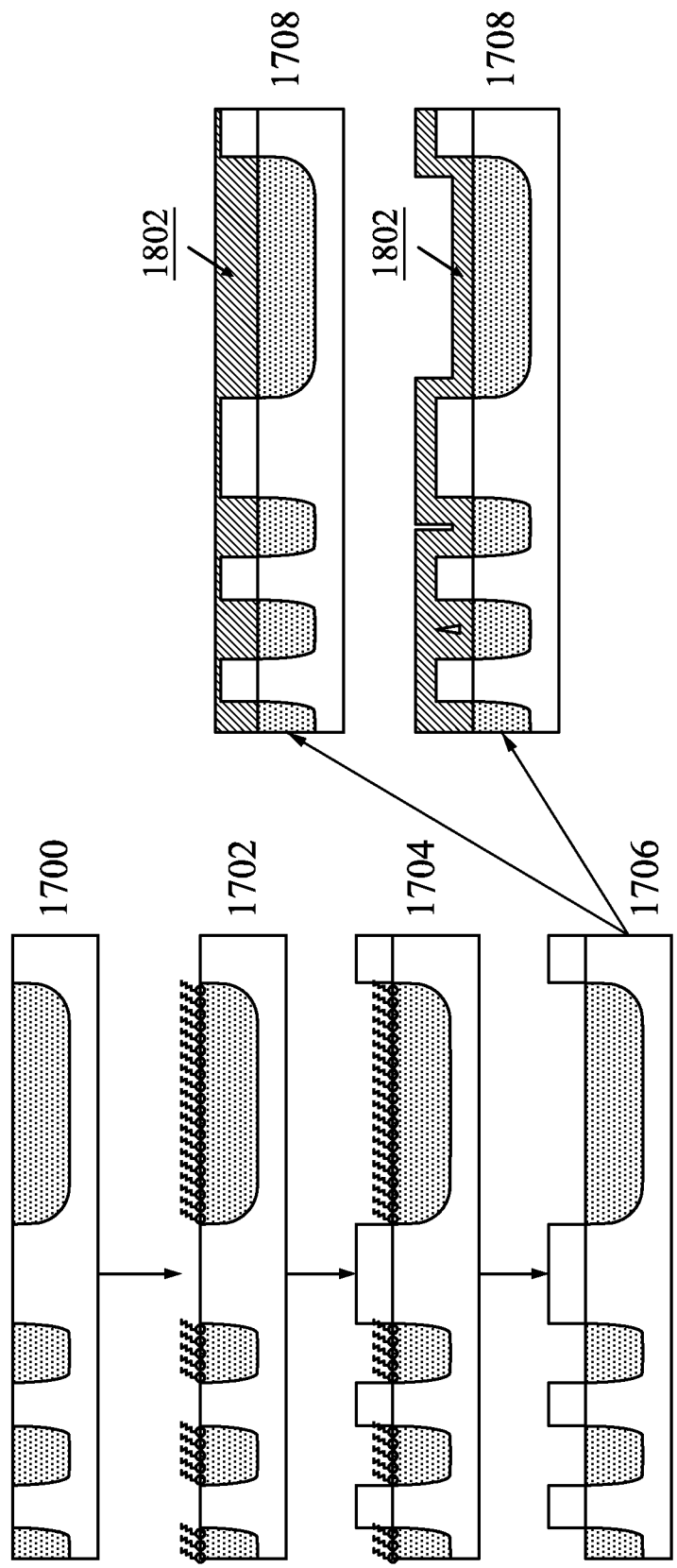
FIG. 18 illustrates cross-sectional views of an example semiconductor device during various fabrication stages, made by the method of FIG. 17, in accordance with some embodiments.

FIG. 18 illustrates cross-sectional representations of the structures formed during steps 1700-1708 of the second embodiment method. At step 1700, a substrate is provided where the upper surface contains conductive metal separated by a dielectric. At step 1702, an inhibitor may be selectively deposited on the conductive surface. At step 1704, a dielectric may be deposited on the surface of the wafer in the regions where the inhibitor is not deposited. Step 1704 may result in the dielectric deposited on the dielectric regions of the surface. At step 1706, the inhibitor may be removed. At step 1708 a dielectric may be deposited across the surface of the wafer. The dielectric 1802 may be deposited by spin-on wet processes resulting in gap-fill. The dielectric 1802 may be deposited by chemical vapor deposition (CVD), atomic layer deposition (ALD), or spin-on which may result in a conformal coating of the dielectric 1802 across the surface of the wafer.

Figure 19:
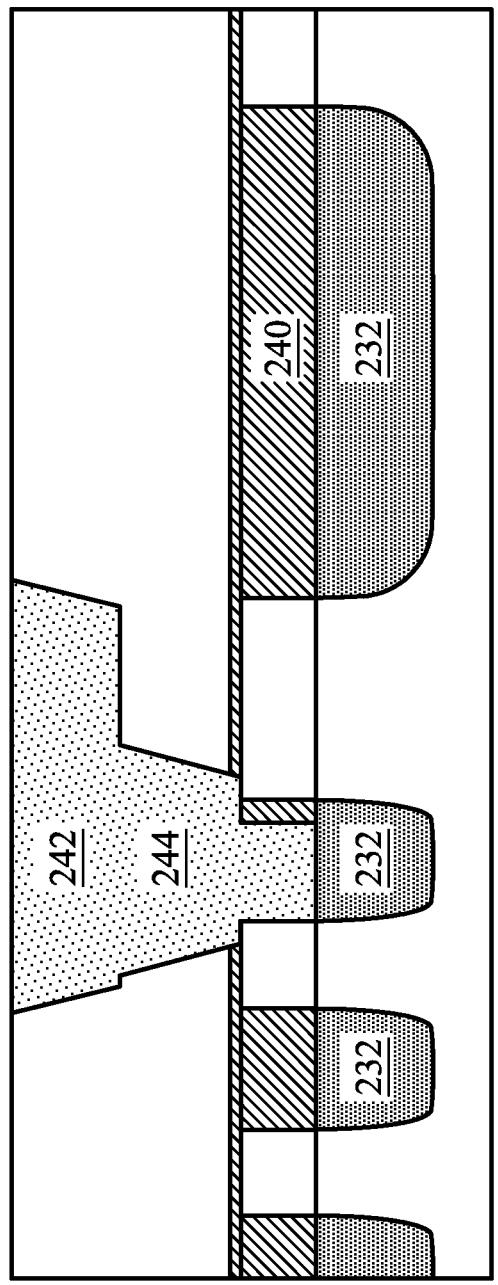
FIGS. 19-20 illustrate cross-sectional views of an example semiconductor device in the case of overlay shift, made by the method of FIG. 1 or FIG. 15, in accordance with some embodiments.
Figure 20:
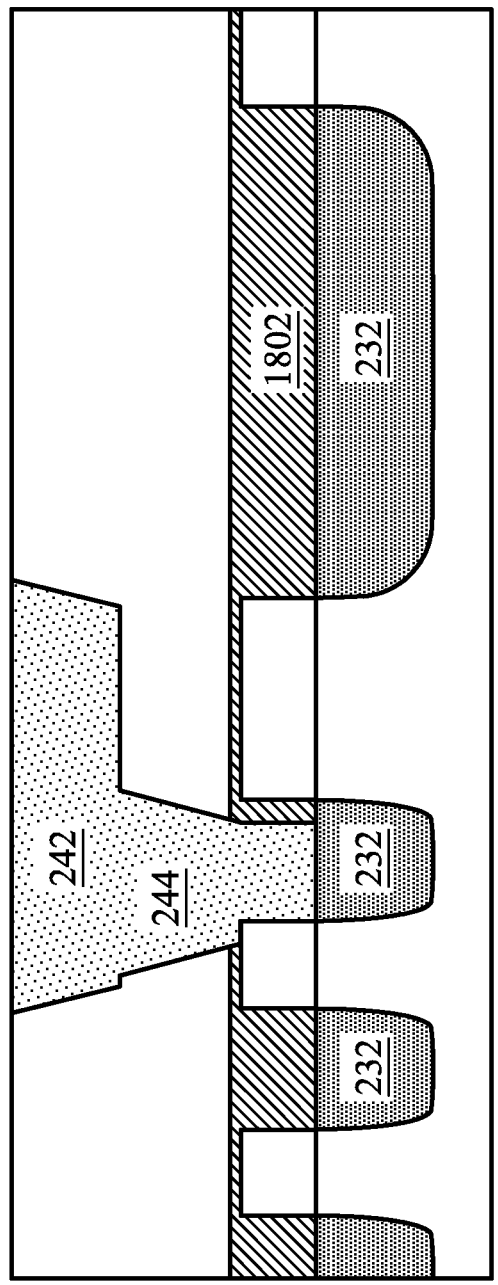

FIGS. 19-20 illustrate one advantage of the present self-aligned via structure in the case of overlay (OVL) shift, for instance, in lithographic patterning. This shift may be due, for instance, to misalignment of the lithographic mask. In the case of OVL shift, the dielectric 240 and dielectric 1802 increases the critical dimension between the via 244 and an adjacent first level conductive region 232. This is due to the difference in the material in the regions formed by the disclosed method. The increase in the critical dimension decreases the via 244 to first level conductive region 232 breakdown and leakage current.

Figure 21:
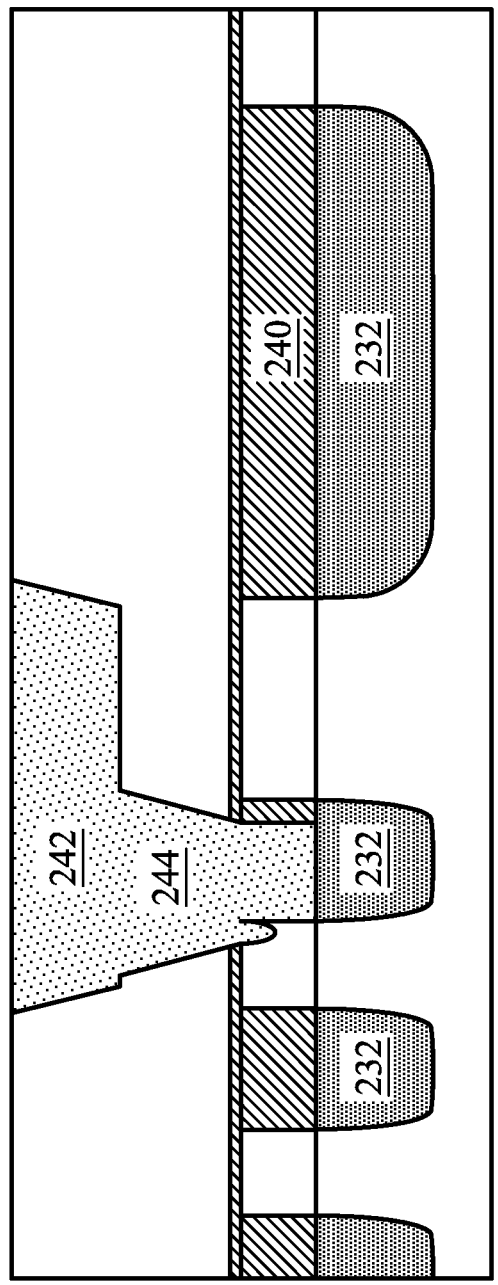
FIGS. 21-22 illustrate cross-sectional views of an example semiconductor device in the case of overlay shift and punch through, made by the method of FIG. 1 or FIG. 15, in accordance with some embodiments.
Figure 22:
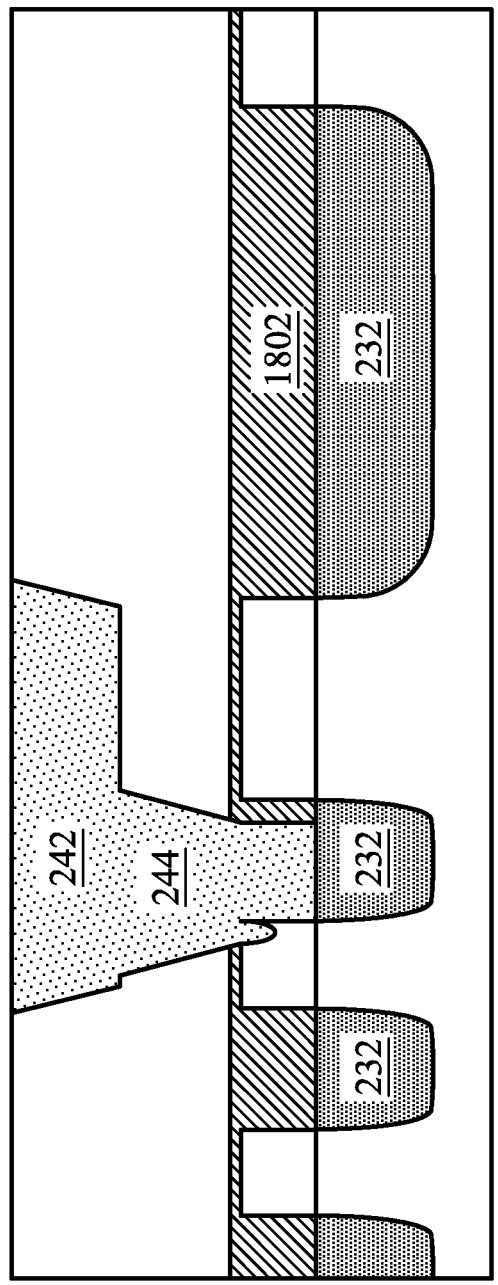

FIGS. 21-22 illustrate one advantage of the present self-aligned via structure in the case of punch through in the case of overlay (OVL) shift for instance in lithographic patterning. In the case of OVL shift with punch through, the dielectric 240 and dielectric 1802 increases the critical dimension between the via 244 and an adjacent first level conductive region 232. The increase in the critical dimension decreases the via 244 to first level conductive region 232 breakdown and leakage current.

Figure 23:
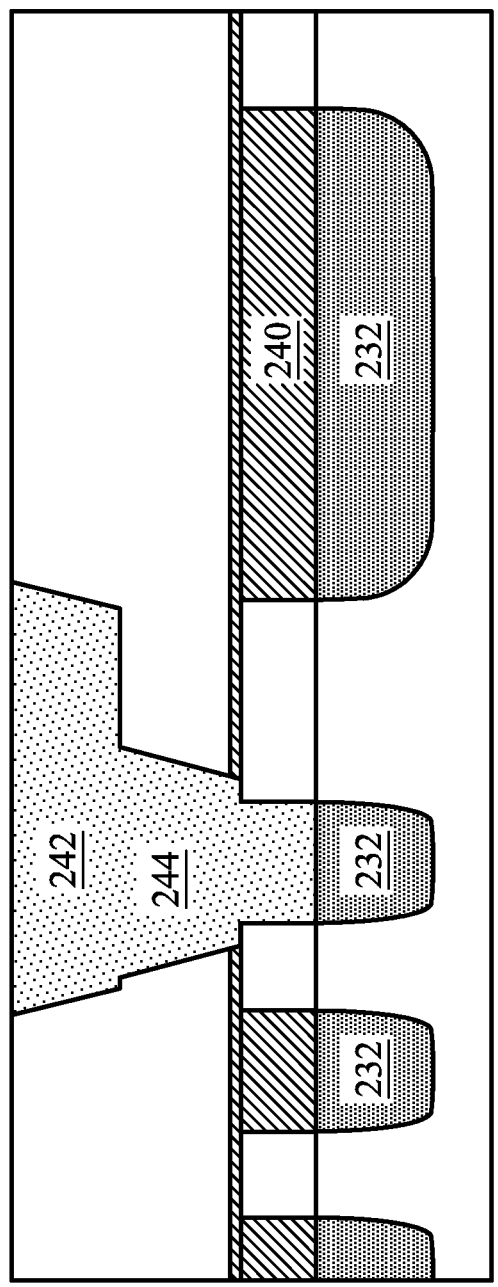
FIGS. 23-24 illustrates cross-sectional views of an example semiconductor device in the case of via critical dimension enlargement, made by the method of FIG. 1 or FIG. 15, in accordance with some embodiments.
Figure 24:
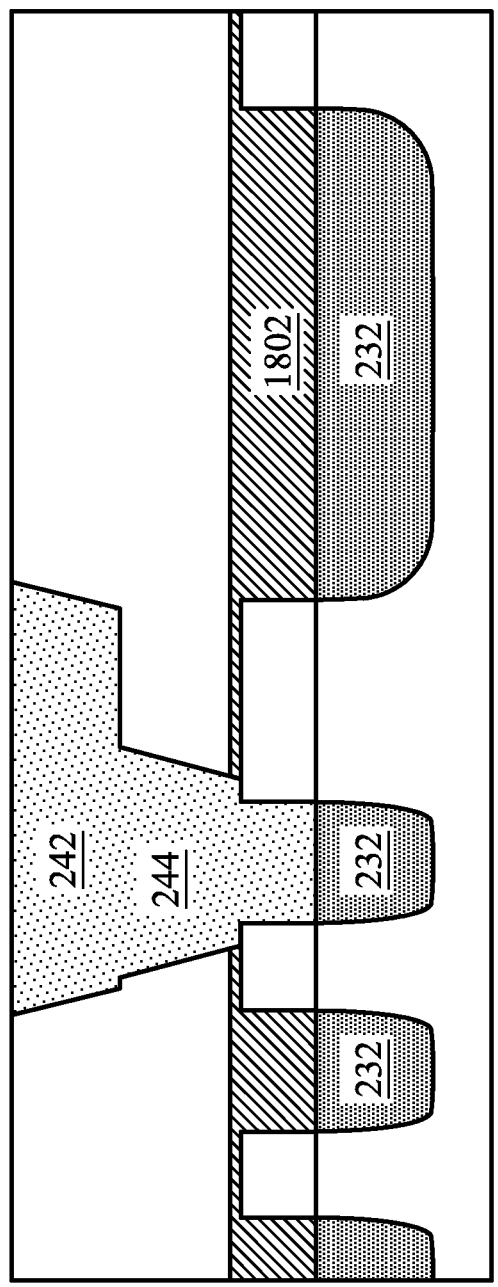

FIGS. 23-24 illustrate one advantage of the present self-aligned via structure in the case of via critical dimension (CD) enlargement, for instance in lithographic patterning. In the case of via CD enlargement, the dielectric 240 and dielectric 1802 increases the critical dimension between the via and an adjacent first level conductive region 232. The increase in the critical dimension decreases the via to first level conductive region breakdown and leakage current.

The resulting structures of embodiment 1 and embodiment 2 presented herein (as well as alternate embodiments) may exhibit self-alignment of the via structure to the bottom metal layer. This may be due to the selective etching of the lower dielectric over the lower conductor. The selectively etched dielectric, formed on the surface of the lower conductor due to blocking of the dielectric by the second inhibitor, may be about the lateral width of the lower conductor. The self-aligned via structure may have the advantages of increased reliability, lower RC performance and lower capacitance. In the case of lithography misalignment, the upper portion of the via may remain self-aligned with the top conductive region while the bottom portion of the via may remain self-aligned with the lower conductive region.

Figure 25:
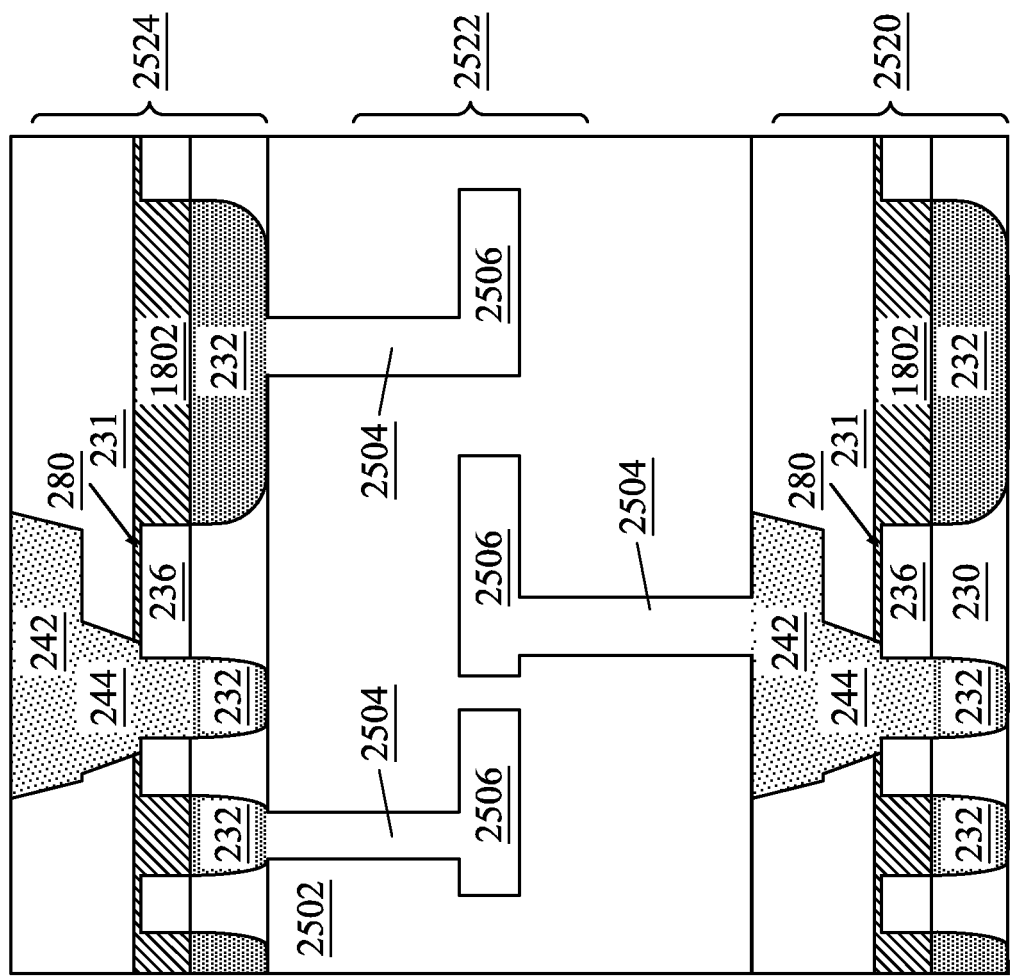
FIG. 25 illustrates cross-sectional views of an example of a multilayer semiconductor where at least one of the layers is made by the method of FIG. 1 or FIG. 15, in accordance with some embodiments.

FIG. 25 illustrates a cross sectional representation of the back end metal interconnects in a multilayer semiconductor in one embodiment. It is noted that the method 100 may be iteratively performed to form one or more subsequent metal interconnect levels of the semiconductor device. For example, by repeating the steps 100-122, the semiconductor device can include another dielectric layer 240, another etch stop layer 280, another dielectric layer 231, another via 244, and another trench conductive region 242 substantially similar to the elements discussed. Thus, the discussions shall not be repeated. This may be repeated until the desired number of layers of metal interconnects are formed. Additionally, some metal layers in the metal layer stack may be formed by alternate methods in the art. For instance, dual damascene or other methods may be used to form some of the metal layers in the metal layer stack.

One example of such a metal layer stack is shown in FIG. 25. In FIG. 25, the metal layers represented by 2520 and 2524 may be formed, for instance, by method 100. In FIG. 25, the metal layer represented by 2522 may be formed by alternate means such as dual damascene. In FIG. 25, the metal lines 2506 and the metal vias 2504 may be formed through the dielectric 2502 by some alternate method of forming metal lines and vias. Those skilled in the art will recognize that metal layers 2520 and 2524 may be formed by an alternate method. Those skilled in the art will further recognize that the metal layer 2522 may be formed by method 100. This is merely one example and those skilled in the art would recognize the many ways to form and many possibilities for the layers in the back end interconnects of a multilayer semiconductor device.

In one embodiment, the device formed may include a semiconductor device made up of one or more multilayer interconnections. Each multilayer interconnection may include two or more first level conductors 232 and one or more second level conductors 242. The first and second layer conductors may be separated by a first dielectric material 231 through which is formed at least one via conductor through the dielectric material 231. The via conductor may couple the second level conductor 242 to the first level conductor 232.

In some embodiments, the lateral width of the lower portion of the via conductor may correspond with the lateral width at least one first level conductor 232 it connects. In some embodiments, a second first level conductor 232 may be covered by a second dielectric material 240. In some embodiments, the second dielectric material 240 may be a different dielectric material than dielectric material 231. In some embodiments, the lateral width of the second dielectric material 240 may correspond to the lateral width of the second first level conductor 232. In some embodiments, the via may be a cavity through the dielectric 231 layer between a first layer metal conductor 232 and a second layer metal conductor 242 filled with a metal material.

In some embodiments, the second dielectric 240 may be a dielectric with high removal selectivity. In some embodiments, the second dielectric 240 may be a dielectric comprising one or more of aluminum, zirconium, yttrium, hafnium, and titanium. The second dielectric 240 may be a dielectric material with a low dielectric constant and may be one or more of silicon, oxygen, carbon, and nitrogen. In some embodiments, the thickness of the second dielectric 240 may be greater than or equal to 5 angstroms and less than or equal to 70 nanometers.

In one embodiment, the method describe may include forming a semiconductor device by supplying a substrate comprising two or more first level conductors 232 separated by a third dielectric material 230. The method may include selectively depositing a first inhibitor 234 on the first level conductors 232. The method may include depositing a fourth dielectric material 236 on the surfaces of the substrate not coated by the first inhibitor 234. The method may include removing the first inhibitor 234. The method may include selectively depositing a second inhibitor 238 on the third dielectric material 230. The method may include depositing a second dielectric material 240 on the surfaces of the substrate not coated by the second inhibitor 238. The method may include removing the second inhibitor 238. The method may include depositing a first dielectric material 231 over the surface of the substrate, forming a cavity through the first dielectric 231 layer, and filling the cavity with a metal material to form a via between a first layer metal conductor 232 and a second layer metal conductor 242.

The fourth dielectric material 236 and the second dielectric material 240 may be different dielectric materials. The first inhibitor 234 may be a self-assembled monolayer and may be formed by one of vapor atomic layer deposition, chemical vapor deposition, spin-on coating, dip coating or spraying. The second inhibitor 238 may be a self-assembled monolayer and may be formed by one of vapor atomic layer deposition, chemical vapor deposition, spin-on coating, dip coating or spraying. The first inhibitor 234 may be treated by one or more of gas soak, plasma treatment, acid treatment, and solution treatment. Treatment of the first inhibitor 234 may cause at least partial removal of the inhibitor layer. The second inhibitor 238 may be treated by one or more of gas soak, plasma treatment, acid treatment, and solution treatment. Treatment of the second inhibitor 238 may cause at least partial removal of the inhibitor layer.

In one embodiment, the method may include forming a semiconductor device by supplying a substrate including two or more first level conductors 232 separated by a third dielectric material 230. The method may include selectively depositing a first inhibitor 234 on the first level conductors 232. The method may include depositing a fourth dielectric material 236 on the surfaces of the substrate not coated by the first inhibitor 234. The method may include selectively depositing a second inhibitor 238 on the third dielectric material 230. The method may include depositing a second dielectric material 240 on the surfaces of the substrate not coated by the second inhibitor 238. The method may include depositing a first dielectric material 231 over the surface of the substrate, forming a cavity through the first dielectric 231 layer and filling the cavity with a metal material to form a via between at least one first layer metal conductor 232 and a second layer metal conductor 242.

The method may include forming the first dielectric 231, the second dielectric 240, the third dielectric 230 or the fourth dielectric 236 by chemical vapor deposition, atomic layer deposition, molecular layer deposition, spin-on, or catalyzed growth processes. The first dielectric 231, the second dielectric 240, the third dielectric 230 or the fourth dielectric 236 may be a low-k dielectric. The first inhibitor 234 may be an anchor group and may be one of phosphorus, sulfur, silicon, carbon, and nitrogen. The second inhibitor 238 may be an anchor group and may be one of silicon, carbon, and nitrogen.

In some embodiments, the second layer metal conductor 242 is lifted by the fourth dielectric material 236. In some embodiments, the fourth dielectric material 236 is different from the third dielectric material 230 and the first dielectric material 231. In some embodiments, the via 244 is lifted by the fourth dielectric material.

In one aspect of the disclosure, disclosed is a semiconductor device. The semiconductor device includes one or more multilayer interconnections. The multilayer interconnection includes two or more first level conductors and one or more second level conductors separated by a first dielectric material. The multilayer interconnection includes at least one via conductor extending through the first dielectric material and coupling at least one second level conductor to at least one first level conductor. The lateral width of a lower portion of the at least one via conductor may correspond with a lateral width of the at least one first level conductor. A second first level conductor may be covered by a second dielectric material. The second dielectric material may be a different dielectric material than the first dielectric material. The lateral width of the second dielectric material may correspond to the lateral width of the second first level conductor.

In another aspect of the disclosure, disclosed is a method of forming a semiconductor device. The method may include supplying a substrate comprising two or more first level conductors separated by a third dielectric material. The method may include depositing a first inhibitor over the first level conductors. The method may include depositing a fourth dielectric material on a portion of a surface of the substrate not overlaid by the first inhibitor. The method may include forming a via coupled to one of the first level conductors.

In yet another aspect of the disclosure, disclosed is a method of forming a semiconductor device. The method may include supplying a substrate comprising two or more first level conductors separated by a third dielectric material. The method may include selectively depositing a first inhibitor on the third dielectric material. The method may include depositing a fourth dielectric material on the surfaces of the substrate not coated by the first inhibitor. The method may include selectively depositing a second inhibitor on the first level conductors. The method may include depositing a second dielectric material on the surfaces of the substrate not coated by the second inhibitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first dielectric layer disposed over a substrate;
   a first conductor and a second conductor disposed in the first dielectric layer, top surfaces of the first conductor, the second conductor, and the first dielectric layer are horizontally aligned;
   a second dielectric layer disposed over the top surface of the first conductor, wherein sidewalls of the second dielectric layer are vertically aligned with sidewalls of the first conductor;
   a third dielectric layer disposed adjacent the second dielectric layer and interposed between the first conductor and the second conductor, wherein the third dielectric layer and the second dielectric layer have different compositions;
   a via coupled to the second conductor, wherein a first sidewall of the via is vertically aligned with a first sidewall of the second conductor and a second sidewall of the via is separated from a sidewall of the third dielectric layer; and
   a fourth dielectric layer interposed between the second sidewall of the via and the sidewall of the third dielectric layer, wherein the fourth dielectric layer and the second dielectric layer have the same composition.

2. The semiconductor structure of claim 1, wherein the second dielectric layer has a higher removal selectivity with respect to the third dielectric layer.

3. The semiconductor structure of claim 1, wherein the second dielectric layer includes at least one metal selected from the group consisting of aluminum, zirconium, yttrium, hafnium, and titanium.

4. The semiconductor structure of claim 3, wherein the second dielectric layer includes at least one material selected from the group consisting of oxide, nitride, and carbide.

5. The semiconductor structure of claim 1, wherein the third dielectric layer includes a dielectric material with a low dielectric constant, the dielectric material including at least one material selected from the group consisting of silicon, oxygen, carbon, and nitrogen.

6. The semiconductor structure of claim 1, wherein a top surface of the third dielectric layer includes a first portion and a second portion disposed below the first portion.

7. A semiconductor structure, comprising:
   a first dielectric layer disposed over a substrate;
   a first conductor and a second conductor disposed in the first dielectric layer, top surfaces of the first conductor, the second conductor, and the first dielectric layer are horizontally aligned;
   a second dielectric layer disposed over the top surface of the first conductor, wherein sidewalls of the second dielectric layer are vertically aligned with sidewalls of the first conductor;
   a third dielectric layer disposed adjacent the second dielectric layer and interposed between the first conductor and the second conductor, wherein the third dielectric layer and the second dielectric layer have different compositions;
   a via coupled to the second conductor, wherein a bottom portion of the via is embedded in the third dielectric layer; and
   a fourth dielectric layer disposed between a sidewall of the via and the third dielectric layer, and wherein the fourth dielectric layer and the second dielectric layer comprise a same metal-containing material.

8. The semiconductor structure of claim 7, wherein the second dielectric layer includes at least one metal selected from the group consisting of aluminum, zirconium, yttrium, hafnium, and titanium.

9. The semiconductor structure of claim 8, wherein the at least one metal is included in at least one material selected from the group consisting of oxide, nitride, and carbide.

10. The semiconductor structure of claim 7, further comprising:
    a fifth dielectric layer over the second dielectric layer; and
    a third conductor disposed in the fifth dielectric layer and coupled to a top portion of the via, wherein the top portion of the via is embedded in the fifth dielectric layer.

11. The semiconductor structure of claim 10, wherein the fifth dielectric layer, the first dielectric layer, and the third dielectric layer have the same composition.

12. The semiconductor structure of claim 10, wherein the top portion of the via is laterally offset from the bottom portion.

13. The semiconductor structure of claim 7, wherein the first dielectric layer and the third dielectric layer each include a dielectric material with a low dielectric constant, the dielectric material including at least one material selected from the group consisting of silicon, oxygen, carbon, and nitrogen.

14. The semiconductor structure of claim 7, wherein sidewalls of the bottom portion of the via are vertically aligned with sidewalls of the second conductor.

15. A semiconductor structure, comprising:
    a first dielectric layer disposed over a substrate;
    a first conductor and a second conductor disposed in the first dielectric layer, top surfaces of the first conductor, the second conductor, and the first dielectric layer are horizontally aligned;
    a second dielectric layer disposed over the top surface of the first conductor, wherein sidewalls of the second dielectric layer are vertically aligned with sidewalls of the first conductor;
    a third dielectric layer disposed adjacent the second dielectric layer and interposed between the first conductor and the second conductor, wherein the third dielectric layer and the second dielectric layer have different compositions;

a via coupled to the second conductor, wherein a first sidewall of a bottom portion of the via is aligned with a first sidewall of the second conductor; and a fourth dielectric layer disposed along a second sidewall of the bottom portion of the via, wherein a sidewall of the fourth dielectric layer is aligned with a second sidewall of the second conductor; and wherein the second dielectric layer and the fourth dielectric layer comprise a metal-containing material having a higher removal selectivity than the third dielectric layer, and wherein the third dielectric layer comprises a low-k dielectric material including at least one of silicon, oxygen, carbon, and nitrogen.

16. The semiconductor structure of claim 15, further comprising a fifth dielectric layer overlaying top surfaces of the second dielectric layer and the third dielectric layer, wherein a top portion of the via is adjacent the fifth dielectric layer.

17. The semiconductor structure of claim 15, wherein the second dielectric layer includes at least one metal selected from the group consisting of aluminum, zirconium, yttrium, hafnium, and titanium.

18. The semiconductor structure of claim 15, wherein the third dielectric layer includes a dielectric material with a low dielectric constant, the dielectric material including at least one material selected from the group consisting of silicon, oxygen, carbon, and nitrogen.

19. The semiconductor structure of claim 15, wherein the fourth dielectric layer and the second dielectric layer have the same composition.

20. The semiconductor structure of claim 15, wherein the second dielectric layer and the fourth dielectric layer comprise a metal-containing material having a higher removal selectivity than the third dielectric layer, and wherein the metal-containing material includes at least one metal selected from the group consisting of aluminum, zirconium, yttrium, hafnium, and titanium.

* * * * *